United States Patent
Kaneko et al.

[11] Patent Number: 5,955,931
[45] Date of Patent: Sep. 21, 1999

[54] CHIP TYPE FILTER WITH ELECTROMAGNETICALLY COUPLED RESONATORS

[75] Inventors: Toshimi Kaneko, Sabae; Kazuo Dougauchi, Fukui-ken; Katsuji Matsuta, Fukui; Masahiko Kawaguchi, Takefu, all of Japan

[73] Assignee: Murata Manufacturing Co., Ltd., Nagaokakyo, Japan

[21] Appl. No.: 08/584,297

[22] Filed: Jan. 11, 1996

[30] Foreign Application Priority Data

Jan. 9, 1995 [JP] Japan ................................. 7-018494

[51] Int. Cl.⁶ .................................................... H03H 7/00
[52] U.S. Cl. ............................................. 333/175; 333/185
[58] Field of Search .................................. 333/202–205, 333/185, 238, 246, 175, 177, 174

[56] References Cited

U.S. PATENT DOCUMENTS

| | | | |
|---|---|---|---|
| 4,203,081 | 5/1980 | Braeckelmann | 333/185 |
| 4,757,285 | 7/1988 | Krause | 333/202 |
| 4,888,568 | 12/1989 | Kawaguchi | 333/205 |
| 5,075,650 | 12/1991 | Okamura et al. | 333/185 |
| 5,105,176 | 4/1992 | Okamura et al. | 333/185 |
| 5,404,118 | 4/1995 | Okamura et al. | 333/175 |
| 5,506,551 | 4/1996 | Kaneko et al. | 333/175 X |
| 5,521,564 | 5/1996 | Kaneko et al. | 333/175 |

FOREIGN PATENT DOCUMENTS

| | | | |
|---|---|---|---|
| 662848 A1 | 11/1994 | European Pat. Off. | 333/185 |
| 58-42301 | 3/1983 | Japan | 333/204 |
| 60-42917 | 3/1985 | Japan | 333/185 |
| 4-207707 | 7/1992 | Japan | 333/185 |
| 6-6104 | 1/1994 | Japan | 333/204 |
| 7408-096 | 12/1974 | Netherlands | 333/185 |

*Primary Examiner*—Seungsook Ham
*Attorney, Agent, or Firm*—Burns, Doane, Swecker & Mathis, LLP

[57] ABSTRACT

There is provided a chip type filter which can be made compact, allows the matching of input/output impedance, and has preferable characteristics. A ground electrode is formed on one side of a dielectric substrate, and spiral-shaped pattern electrodes are formed on the other side. Input/output electrodes are led out from intermediate portions of the pattern electrodes. Curved portions are formed between the input/output electrodes and the ends of the pattern electrodes. The ends of the pattern electrodes are positioned close to each other. Protective layers are formed on the ground electrode and pattern electrodes, which are laminated and integrated to form external electrodes. The ends of the pattern electrodes and the ground electrode are connected by one of the external electrodes.

10 Claims, 11 Drawing Sheets

CHIP TYPE FILTER WITH ELECTROMAGNETICALLY COUPLED RESONATORS

BACKGROUND OF THE INVENTION

1. Field of the Invention

The present invention relates to chip type filters and, more particularly, to a chip type filter in which resonators having a quarter wavelength, for example, are electro-magnetically coupled to one another.

2. Description of the Related Art

FIG. 15 is a perspective view showing an example of a conventional chip type filter. The chip type filter 1 includes a dielectric substrate 2. A ground electrode 3 is formed on the entire surface of one side of the dielectric substrate 2. Two linear pattern electrodes 4a and 4b are formed on the other side of the dielectric substrate 2 so that they are opposite to the ground electrode 3. One end of each of the pattern electrodes 4a and 4b is connected to the ground electrode 3 through an end face of the dielectric substrate 2. Input/output electrodes 5a and 5b are formed so that they extend respectively from the middle of the pattern electrodes 4a and 4b to opposite sides of the dielectric substrate 2. These input/output electrodes 5a and 5b are formed at intervals from the ends of the pattern electrodes 4a and 4b, respectively, which are connected to the ground electrode 3. A micro strip line is formed by the dielectric substrate 2, ground electrode 3, and pattern electrodes 4a and 4b. Each of the pattern electrodes 4a and 4b forms a resonator having a quarter wavelength, and a filter is formed as a result of the electromagnetic coupling of those resonators. The input/output impedance of this chip type filter 1 is adjusted by adjusting the intervals between the input/output electrodes 5a and 5b and the ground electrode 3.

The length L of a pattern electrode of a strip line resonator is generally expressed by $L=\lambda/(4(\epsilon_{re})1/2)$ where $\lambda$ represents the wavelength and $\epsilon_{re}$ represents the effective dielectric constant of the dielectric substrate. As apparent from the equation, the size of a chip type filter may be reduced by using a dielectric material having a high dielectric constant. However, since the use of a dielectric material having a high relative dielectric constant results in problems associated with the temperature characteristics thereof, the relative dielectric constant of the materials actually used is up to about $\epsilon_r=100$.

If this relative dielectric constant is treated as the effective dielectric constant as it is, the pattern electrode will be very long, e.g., as long as 7.5 mm when the frequency used is 1 GHz. When linear pattern electrodes are used, since the length along which they face each other is long, there will be excessive coupling between the electromagnetic fields of those resonators. In order to optimize the electromagnetic coupling, a large interval must be provided between the two pattern electrodes, which results in an increase in the size of the chip type filter.

In order to avoid the above-described problem, the pattern electrodes 4a and 4b may be provided in the form of a spiral as shown in FIG. 16. By providing the pattern electrodes 4a and 4b in the form of a spiral, this chip type filter 1 can be made smaller than a chip type filter having linear pattern electrodes. Further, the length in which the pattern electrodes 4a and 4b face each other is small, which results in weaker electromagnetic coupling. Thus, it is possible to make the pattern electrodes 4a and 4b closer to each other to provide a smaller chip type filter without making the coupling of electromagnetic fields too strong.

In a chip type filter having spiral-shaped pattern electrodes as described above, the interval between one end of a pattern electrode and an input/output electrode becomes small as a result of the reduction of the size of the filter. This results in problems such as increased insertion loss due to difficulty in matching input and output impedance. The width of the pattern electrodes may be reduced to correct the mismatch between input and output impedance. However, this method results in deterioration of Q.

It is therefore an object of the present invention to provide a chip type filter which can be fabricated in a small size, allows the matching of input and output impedance, and provides preferable characteristics.

SUMMARY OF THE INVENTION

According to the present invention, there is provided a chip type filter including a dielectric substrate, a ground electrode formed on one side of the dielectric substrate, a plurality of spiral-shaped pattern electrodes which is formed opposite to the ground electrode on the other side of the dielectric substrate and connected to the ground electrode at one end thereof, and an input/output electrode led out from each pattern electrode at an interval from one end of each pattern electrode, wherein a curved portion is formed between the end of the pattern electrode and the input/output electrode and wherein the end of the pattern electrode and the input/output electrode are led out to different edges of the dielectric substrate.

In this chip type filter, one end of each of the plurality of pattern electrodes is preferably formed close to corresponding ends of other pattern electrodes.

Further, at least a part of the ends of the plurality of pattern electrodes may be coupled to each other.

Two or more locations of the adjoining spiral-shaped portions of the plurality of pattern electrodes may be formed close to each other.

An inductance may be formed in at least one location of the plurality of input/output electrodes of this chip type filter.

Further, the curved portion of the pattern electrode is formed in the form of an arc, for example. If the radii of the inner and outer sides of the curved portion are represented by R1 and R2, respectively, it is desirable that R2/R1=2/1 or more.

In addition, it is desirable that a shield electrode is formed on the pattern electrodes with another dielectric substrate interposed therebetween.

The use of spiral-shaped pattern electrodes allows a filter to be smaller than filters having linear pattern electrodes. The formation of a curved portion between one end of a pattern electrode connected to the ground electrode and an input/output electrode allows the distance therebetween to be expanded. It is therefore possible to maintain a sufficient distance between one end of a pattern electrode and an input/output electrode even if the size of the chip type filter is reduced, and this allows the input/output impedance to be adjusted easily.

The coupling between a plurality of resonators constituted by pattern electrodes can be achieved primarily at two locations and can be adjusted by forming the spiral-shaped portions of the plurality of pattern electrodes close to each other and by making the ends of the plurality of pattern electrodes close to each other or by connecting a part of the ends thereof. Further, the capacitive coupling between the plurality of resonators can be adjusted by providing the plurality of pattern electrodes so that two or more locations of the adjoining spiral-shaped portions thereof are close to each other. The formation of an inductance at an input/output electrode results in the formation of attenuation poles on both sides of the pass band, which improves the Q of the filter. The characteristics of a chip type filter such as the standing wave ratio can be improved by the arrangement wherein the curved portion of a pattern electrode is provided in the form of an arc and wherein the ratio between the radius RI of the inner side and the radius R2 of the outer side of the curved portion is R2/R1=2/1 or more. In addition, the formation of a shield electrode provides a shielding effect.

According to the present invention, by grounding one end of each pattern electrode using a common external power supply, variation in the residual inductance of the resonators up to the ground can be reduced, and this reduces variation in the frequencies of the attenuation poles of the filter.

According to the present invention, there is provided a chip type filter which is compact and whose input/output impedance can be easily adjusted. This allows the input/output impedance of a chip type filter to be matched and makes it possible to provide a chip type filter having excellent characteristics. Further, it is possible to provide a chip type filter having high Q and having a shielding effect. Thus, the characteristics of a chip type filter can be improved.

The above and other objects, features and advantages of the present invention will be more clearly understood from the following description of embodiments of the invention which will be given with reference to the accompanying drawings.

BRIEF DESCRIPTION OF THE DRAWINGS

The present invention will now be described by way of the exemplary embodiments shown in the accompanying drawing figures, in which.

DETAILED DESCRIPTION OF THE PREFERRED EMBODIMENTS

Figure 1:
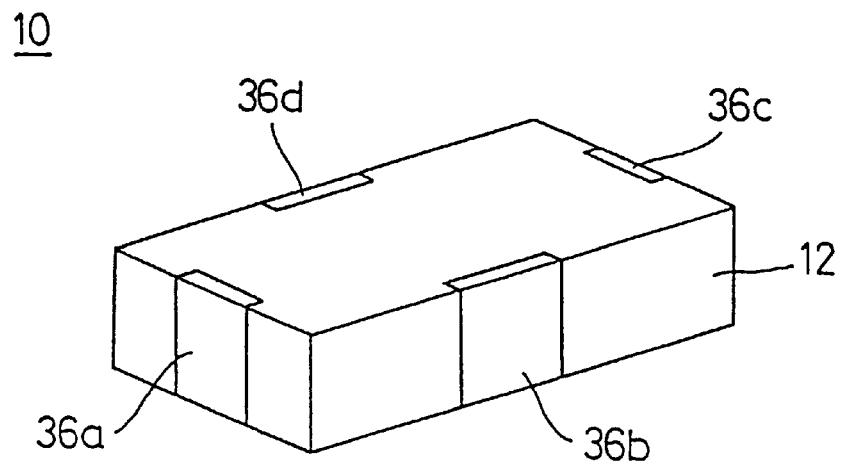
FIG. 1 is a perspective view showing an embodiment of the present invention.
Figure 2:
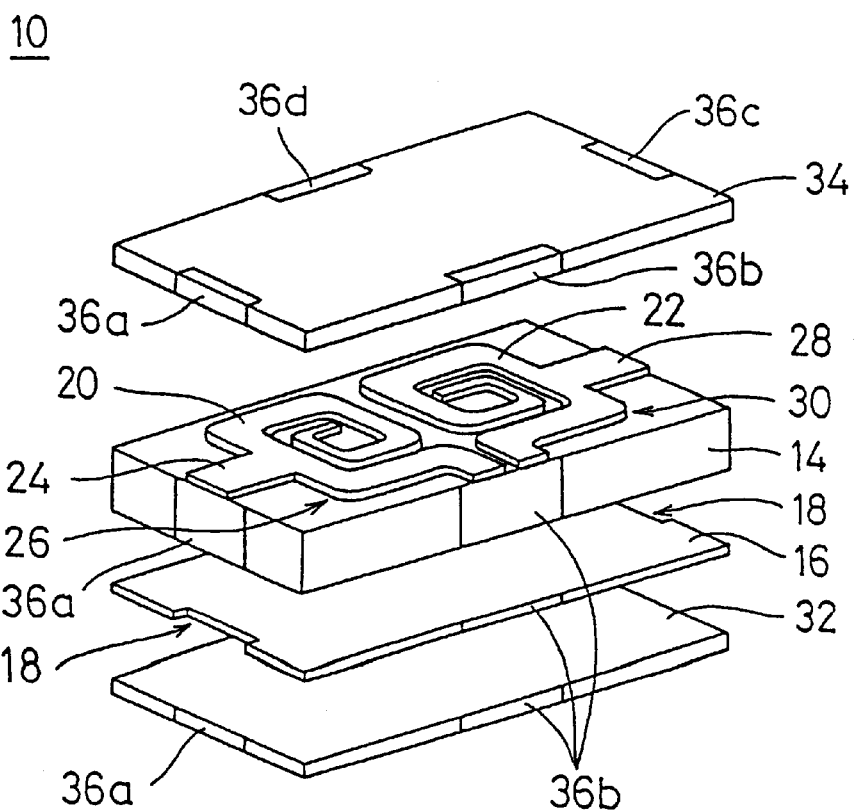
FIG. 2 is an exploded perspective view of the chip type filter shown in FIG. 1.

FIG. 1 is a perspective view showing an embodiment of the present invention, and FIG. 2 is an exploded perspective view of the same. A chip type filter 10 includes a main body 12. The main body 12 includes a dielectric substrate 14. A ground electrode 16 is formed on substantially the entire surface on one side of the dielectric substrate 14. A notch portion 18 is formed at each of the opposite ends of the ground electrode 16.

Figure 3:
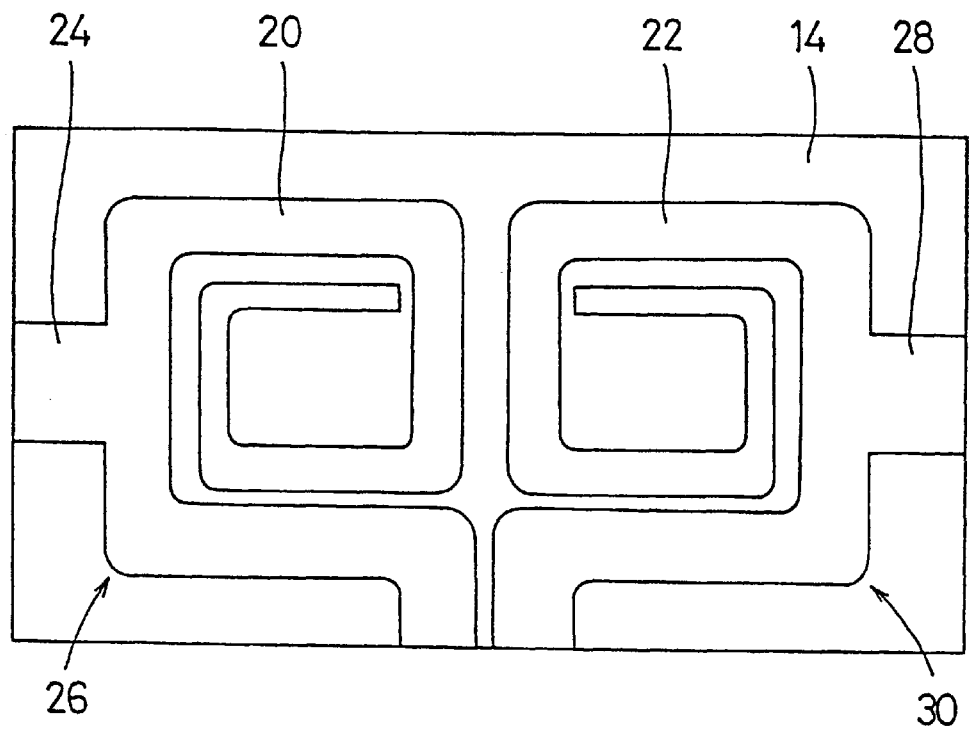
FIG. 3 is a plan view showing a dielectric substrate and pattern electrodes of the chip type filter shown in FIG. 1.

As shown in FIG. 3, two pattern electrodes 20 and 22 are formed on the other side of the dielectric substrate 14. The pattern electrode 20 is provided in the form of a spiral and is led out to a substantially central portion of one edge of the dielectric substrate 14 at one end thereof. Further, an input/output electrode 24 is led out from the pattern electrode 20 to an edge which is adjacent to the edge to which one end of the pattern electrode 20 of the dielectric substrate 14 is led out. A curved portion 26 is formed between the input/output electrode 24 and the end of the pattern electrode 20. The pattern electrode 22 is similarly provided in the form of a spiral and one end thereof is led out to a position which is close to the end of the pattern electrode 20. Another input/output electrode 28 is led out from the pattern electrode 22 to the edge opposite to the edge to which the input/output electrode 24 is led out. A curved portion 30 is formed between the input/output electrode 28 and one end of the pattern electrode 22.

A protective layer 32 is formed on the ground electrode 16. Another protective layer 34 is formed on the pattern electrodes 20 and 22 and the input/output electrodes 24 and 28. The dielectric substrate 14 and the protective layers 32 and 34 are laminated and integrated to form the main body 12. External electrodes 36a, 36b, 36c, and 36d are formed on four edges of the main body 12. The external electrode 36a is connected to the input/output electrode 24. The external electrode 36b is connected to one end of each of the pattern electrodes 20 and 22 and the ground electrode 16. Therefore, one end of each of the pattern electrodes 20 and 22 is connected to the ground electrode 16 through the external electrode 36b. Further, the external electrode 36c is connected to the input/output electrode 28. The external electrode 36d is connected to the ground electrode 16.

In manufacturing the chip type filter 10, the ground electrode 16, pattern electrodes 20 and 22, and input/output terminals 24 and 28 are formed on both sides of the dielectric substrate 14. For example, these electrodes can be formed with high accuracy by forming them using a thin film process and by etching them using photoresist or the like thereafter. Further, the protective layer 32 is formed on the ground electrode 16 using glass or resin. Similarly, the protective layer 34 is formed on the pattern electrodes 20 and 22 and the input/output electrodes 24 and 28 using glass or resin. Thus, the main body 12 is formed. Further, the external electrodes 36a, 36b, 36c, and 36d are formed on the edges of the main body 12. Alternatively, a multiplicity of electrodes may be formed on a larger dielectric substrate which may be cut using a dicing machine or the like after protective layers are formed thereon. Then, external electrodes are formed on the cut chips.

Figure 4:
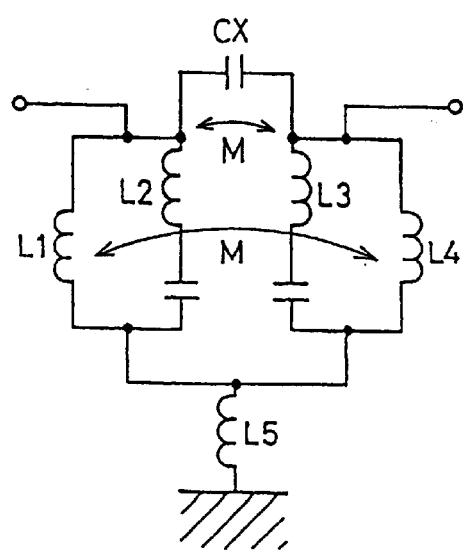
FIG. 4 is an equivalent circuit diagram of the chip type filter shown in FIG. 1.

On this chip type filter 10, two micro strip line resonators are formed by the dielectric substrate 14, ground electrode 16, and spiral-shaped pattern electrodes 20 and 22. A filter is formed as a result of the electromagnetic coupling of these resonators. In this case, the spiral-shaped portions of the adjoining pattern electrodes 20 and 22 are primarily capacitively coupled, and the ends of the pattern electrodes 20 and 22 connected to the ground electrode 16 are primarily inductively coupled. Therefore, this chip type filter 10 has an equivalent circuit as shown in FIG. 4. The reference symbols CX and M at the upper part of FIG. 4 represent the coupling of the electromagnetic fields of the spiral-shaped portions, and the reference symbol M at the lower part represents the inductive coupling of the ends of the pattern electrodes 20 and 22.

This chip type filter 10 can be fabricated smaller than conventional chip type filters having linear pattern electrodes by providing the pattern electrodes 20 and 22 in the form of a spiral. Further, the input/output impedance of the chip type filter 10 can be adjusted by adjusting the distance between the end of the pattern electrode 20 and the input/output electrode 24 and the distance between the end of the pattern electrode 22 and the input/output electrode 28.

In this chip type filter 10, since the curved portions 26 and 30 are formed between the input/output electrodes 24 and 28 and the ends of the pattern electrodes 20 and 22, respectively, it is possible to maintain the distances therebetween larger than those in conventional chip type filters having no curved portion. Therefore, in this chip type filter 10, the input/output impedance can be easily adjusted to be matched compared to conventional chip type filters.

In this chip type filter 10, coupling is achieved at two or more locations, i.e., capacitive coupling is primarily achieved at the spiral-shaped portions of the pattern electrodes 20 and 22 and inductive coupling is achieved at the ends of those electrodes connected to the ground electrode 16. In other words, the capacitive coupling is primarily achieved at the area where a high voltage is distributed and the inductive coupling is primarily achieved at an area where the current density is high. Thus, strong coupling can be achieved. It is therefore possible to reduce the transmission loss of the chip type filter 10 to provide a compact chip type filter having less insertion loss.

Figure 5:
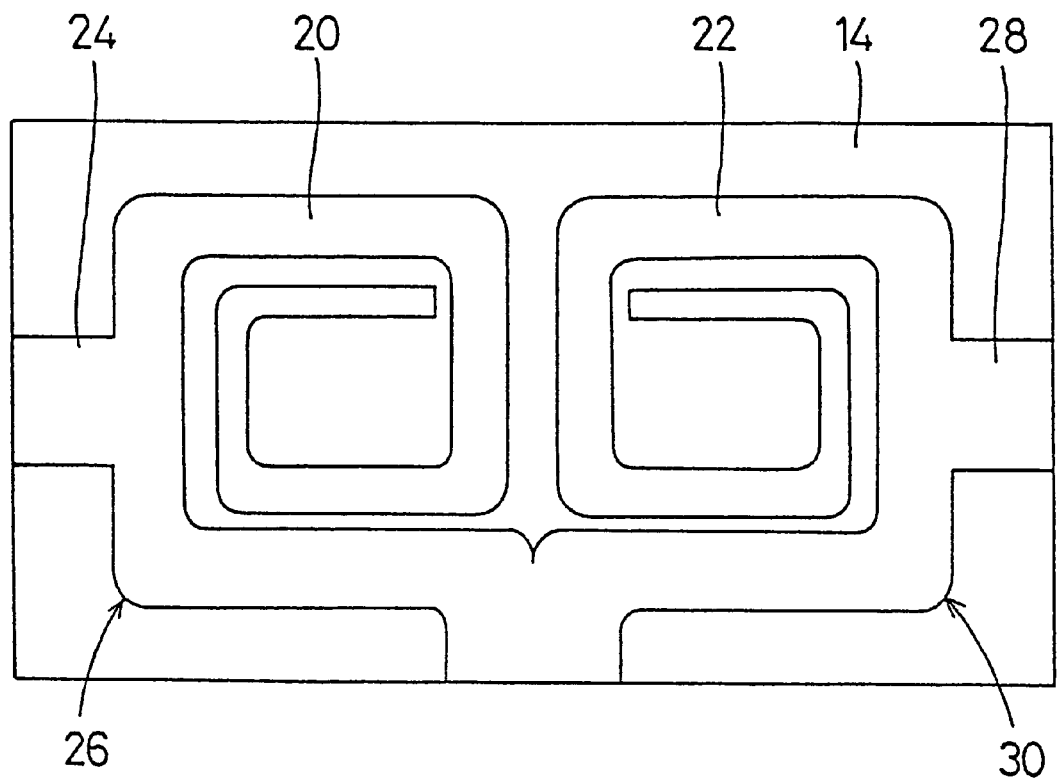
FIG. 5 is a plan view showing a modification of the pattern electrodes.

Further, the formation of the led-out portions of the pattern electrodes 20 and 22 close to each other makes it possible to enhance the inductive coupling between the two resonators. Thus, the coupling between these resonators can be adjusted to provide preferable characteristics. Moreover, the led-out ends of the pattern electrodes 20 and 22 may be connected to each other as shown in FIG. 5. In this case, trimming may be performed to adjust the length of the connected portion, thereby adjusting the degree of the coupling.

Such an arrangement wherein the ends of the pattern electrodes 20 and 22 are close to or connected to each other makes it possible to connect the pattern electrodes 20 and 22 to the ground electrode 16 through the single external electrode 36b. This eliminates the need for fine processing of the external electrodes and reduces the manufacturing cost. In addition, it is possible to increase the size of the external electrodes to improve reliability.

Figure 6:
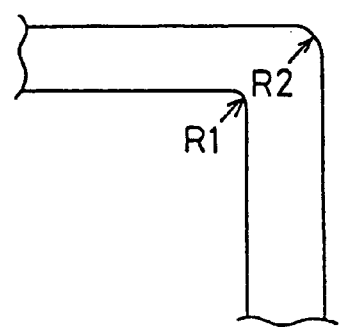
FIG. 6 is a partial view showing a curved portion of a pattern electrode.

The curved portions 26 and 30 of the pattern electrodes 20 and 22 and the curved portions of the spiral-shaped portions are provided in the form of an arc. If the radii of the inner and outer sides of the curved portion are represented by R1 and R2, respectively, as shown in FIG. 6, the curved portion is formed to satisfy R2/R1=2/1 or more. Under such a condition, the standing wave ratio can be improved to obtain preferable characteristics.

Figure 7:
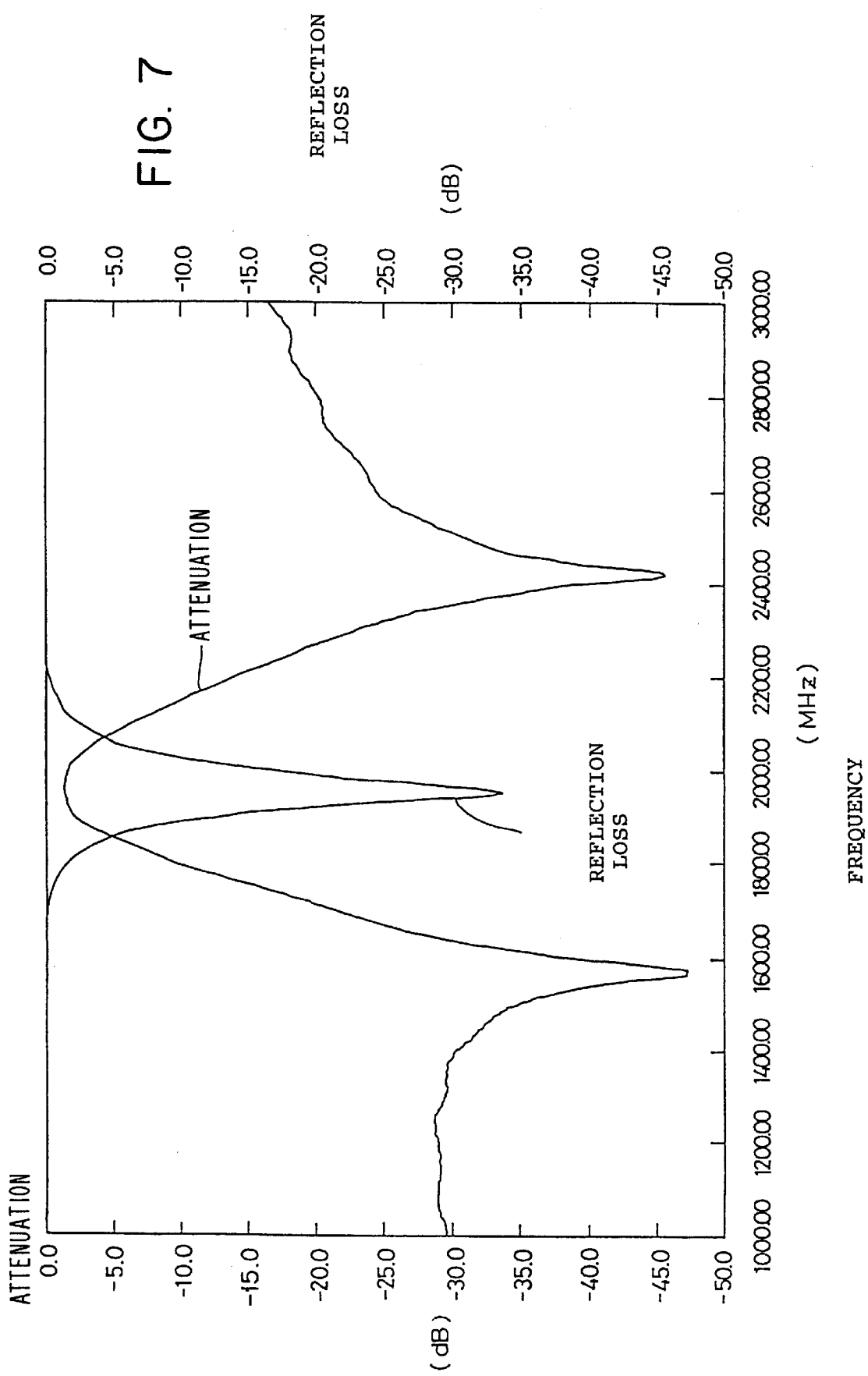
FIG. 7 is a graph showing the frequency characteristics of the chip type filter shown in FIG. 1.
Figure 8:
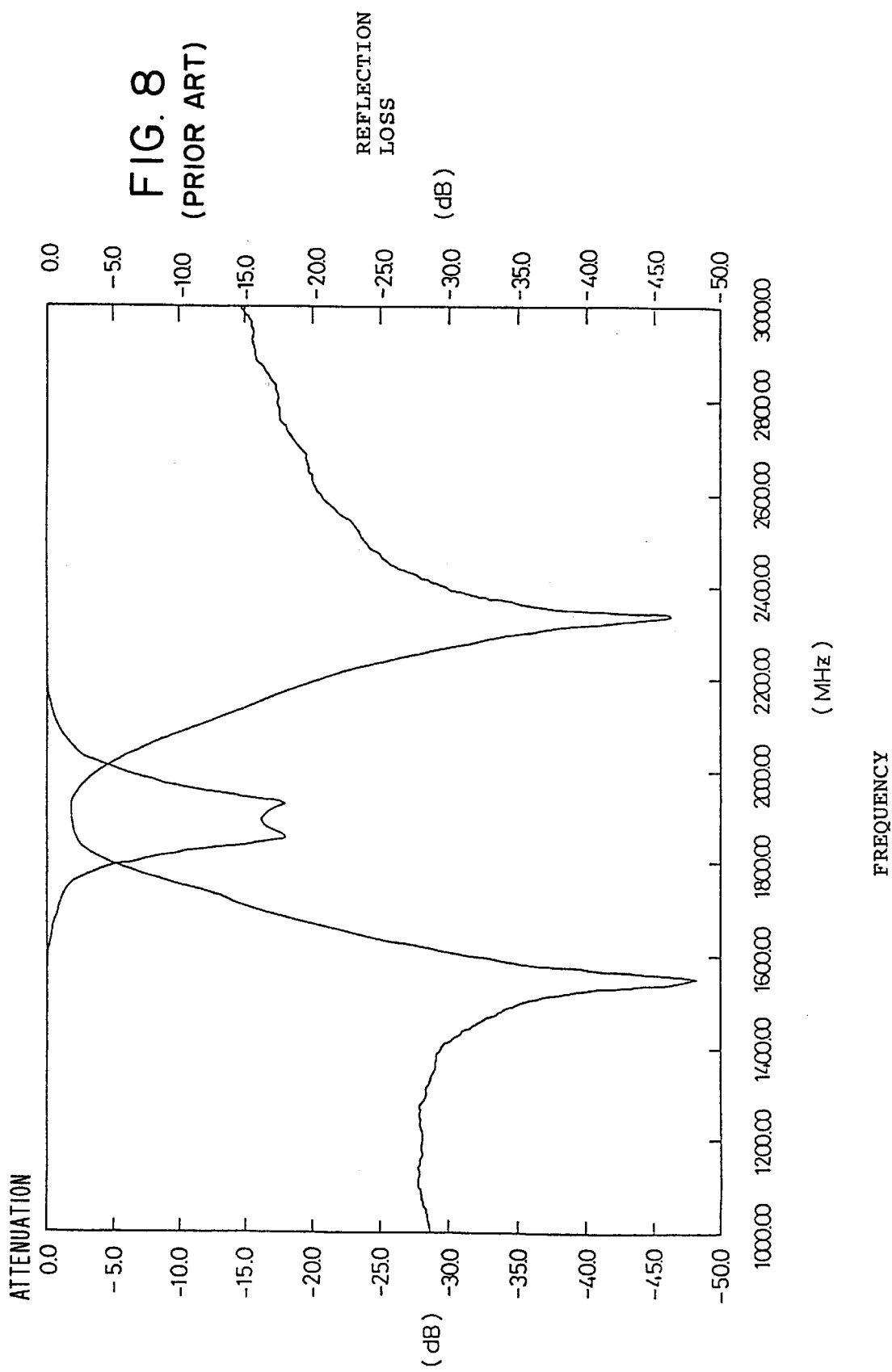
FIG. 8 is a graph showing the frequency characteristics of a conventional chip type filter.
Figure 16:
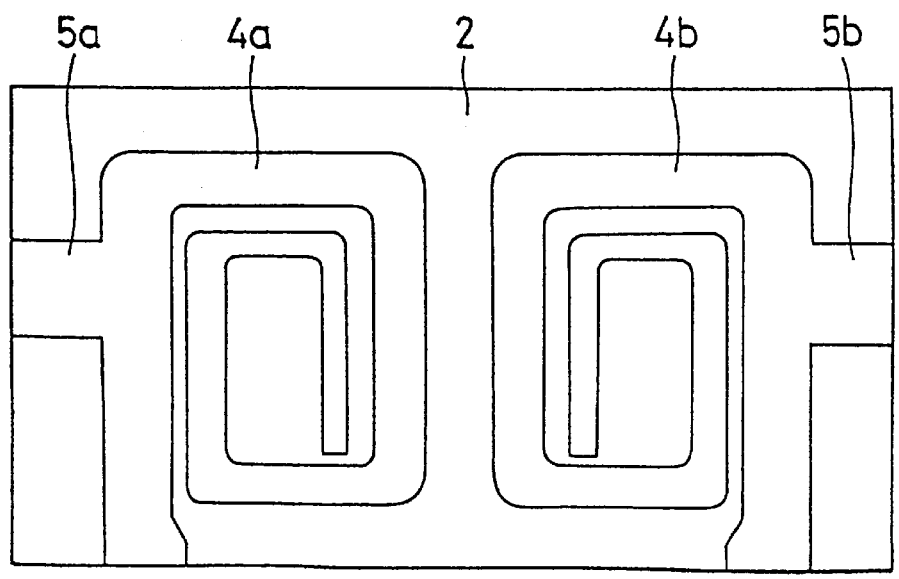
FIG. 16 is a plan view showing another example of a conventional chip type filter.

FIG. 7 shows the characteristics of a chip type filter 10 according to the present invention. FIG. 8 shows the characteristics of the conventional chip type filter shown in FIG. 16. The following table, Table 1, shows a comparison of characteristics between them. As apparent from the characteristic diagrams and Table 1, a compact chip type filter can be provided without reducing the Q thereof, and the insertion loss can be reduced by about 0.5 dB. Further, by etching the internal electrodes using a thin film process, higher filter accuracy can be achieved with the variation of the central frequency reduced to ±1.0% or less.

TABLE 1

|  | Central Frequency (GHz) | −3 dB Bandwidth (MHz) | Insertion Loss (dB) |
| --- | --- | --- | --- |
| Prior Art | 1.910 | 218.0 | 1.86 |
| Embodiment | 1.960 | 217.0 | 1.30 |

Figure 9:
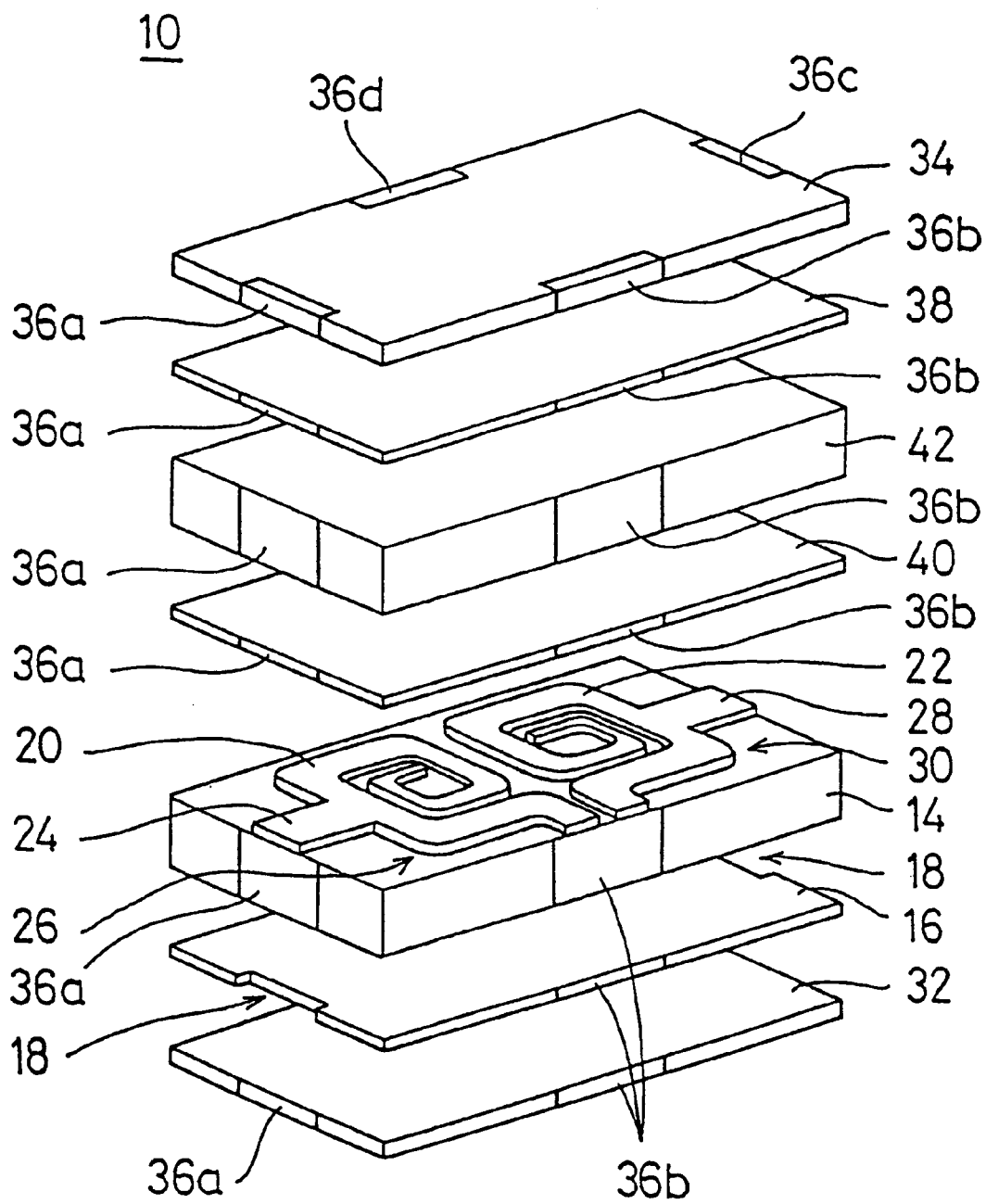
FIG. 9 is an exploded perspective view of a chip type filter on which a shield electrode is formed.
Figure 10:
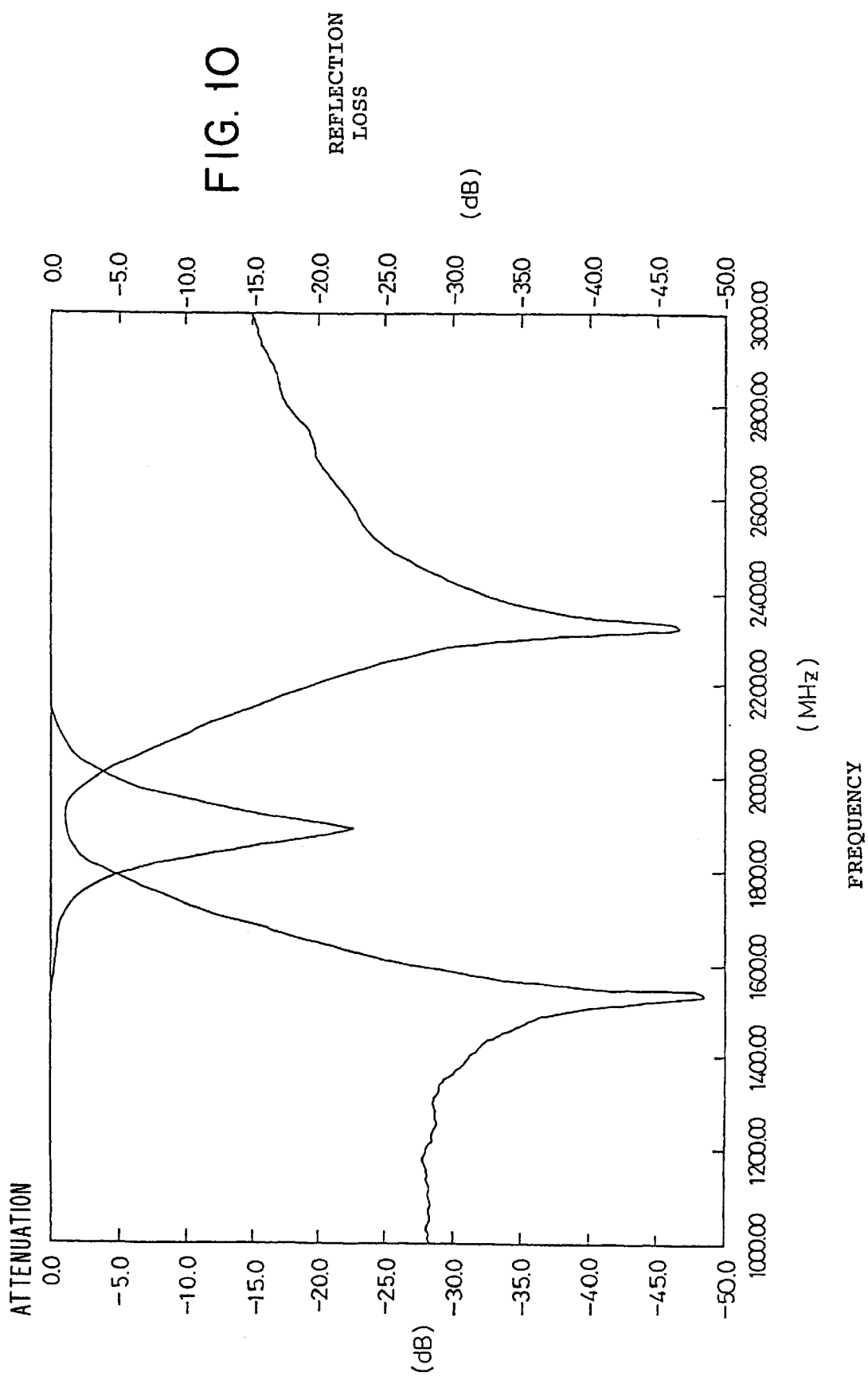
FIG. 10 is a graph showing the frequency characteristics of the chip type filter shown in FIG. 9.

Further, as shown in FIG. 9, a shield electrode 38 may be formed on the pattern electrodes 20 and 22. In this case, an adhesive layer 40 such as a polyimide layer is formed on the pattern electrodes 20 and 22 to bond a dielectric substrate 42 thereto. The shield electrode 38 is formed on the dielectric substrate 42, and a protective layer 34 is formed on the shield electrode 38. In this chip type filter 10, the shield electrode 38 provides a shielding effect that results in preferable characteristics. The characteristics of this chip type filter 10 are shown in FIG. 10 and the following Table 2. As apparent from the characteristics diagram and Table 2, a chip type filter having less insertion loss can be provided. The polyimide bonding makes it possible to provide a compact chip type filter having high filter accuracy. Moreover, the variation of the central frequency of this chip type filter 10 can be reduced to +1.5% or less.

TABLE 2

|  | Central Frequency (GHz) | −3 dB Bandwidth (MHz) | Insertion Loss (dB) |
| --- | --- | --- | --- |
| Embodiment | 1.904 | 217.0 | 1.32 |

Figure 11:
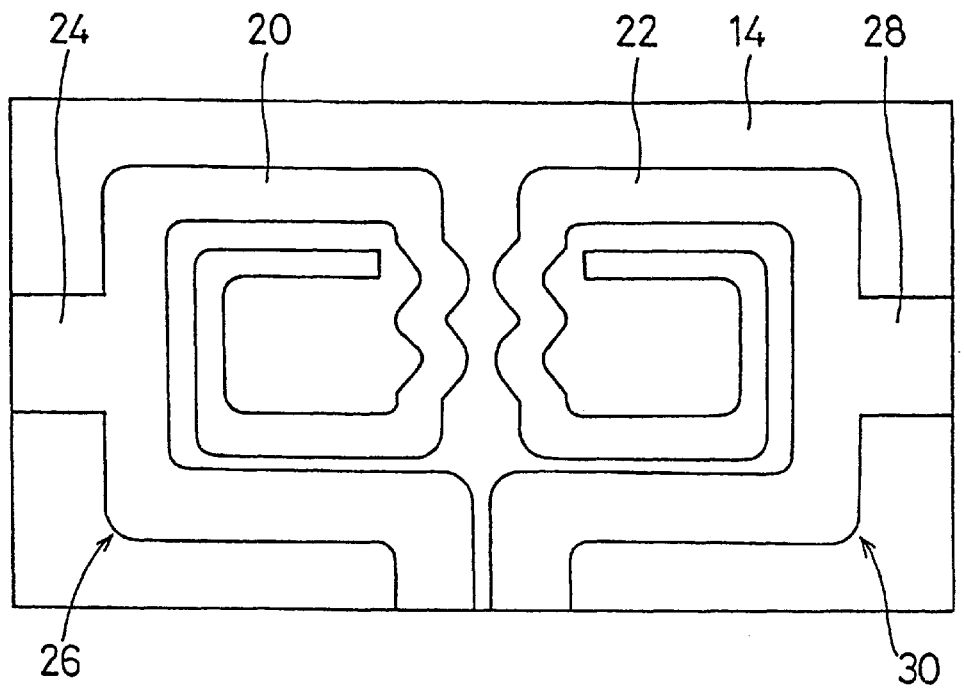
FIG. 11 is a plan view showing another modification of the pattern electrodes.

As shown in FIG. 11, the spiral-shaped portions of the adjoining pattern electrodes 20 and 22 may be formed to be close to each other in two or more locations. Since the two resonators are primarily capacitively coupled in those locations, the capacitive coupling can be adjusted by varying the distance between the pattern electrodes 20 and 22. Therefore, the capacitive coupling can be adjusted by changing the number of the locations in which the pattern electrodes 20 and 22 are close to each other to obtain preferable characteristics.

Figure 12:
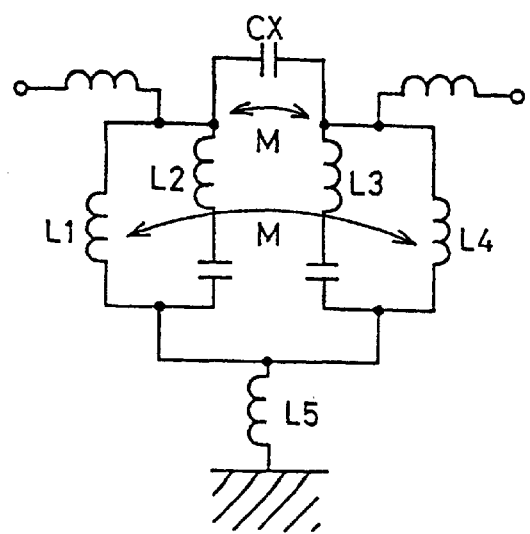
FIG. 12 is an equivalent circuit diagram showing another embodiment of the present invention.
Figure 13:
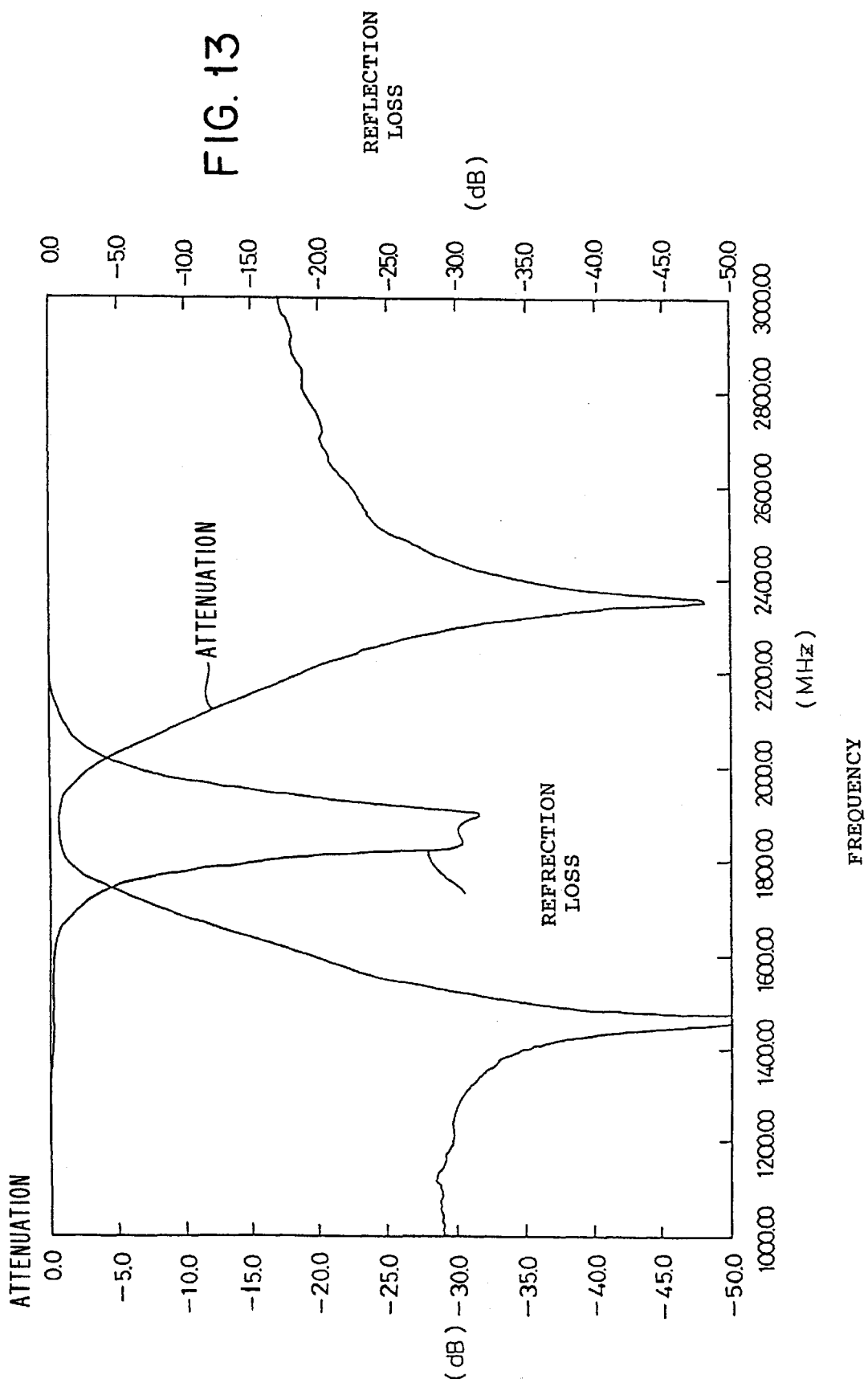
FIG. 13 is a graph showing the frequency characteristics of the chip type filter shown in FIG. 12.
Figure 14:
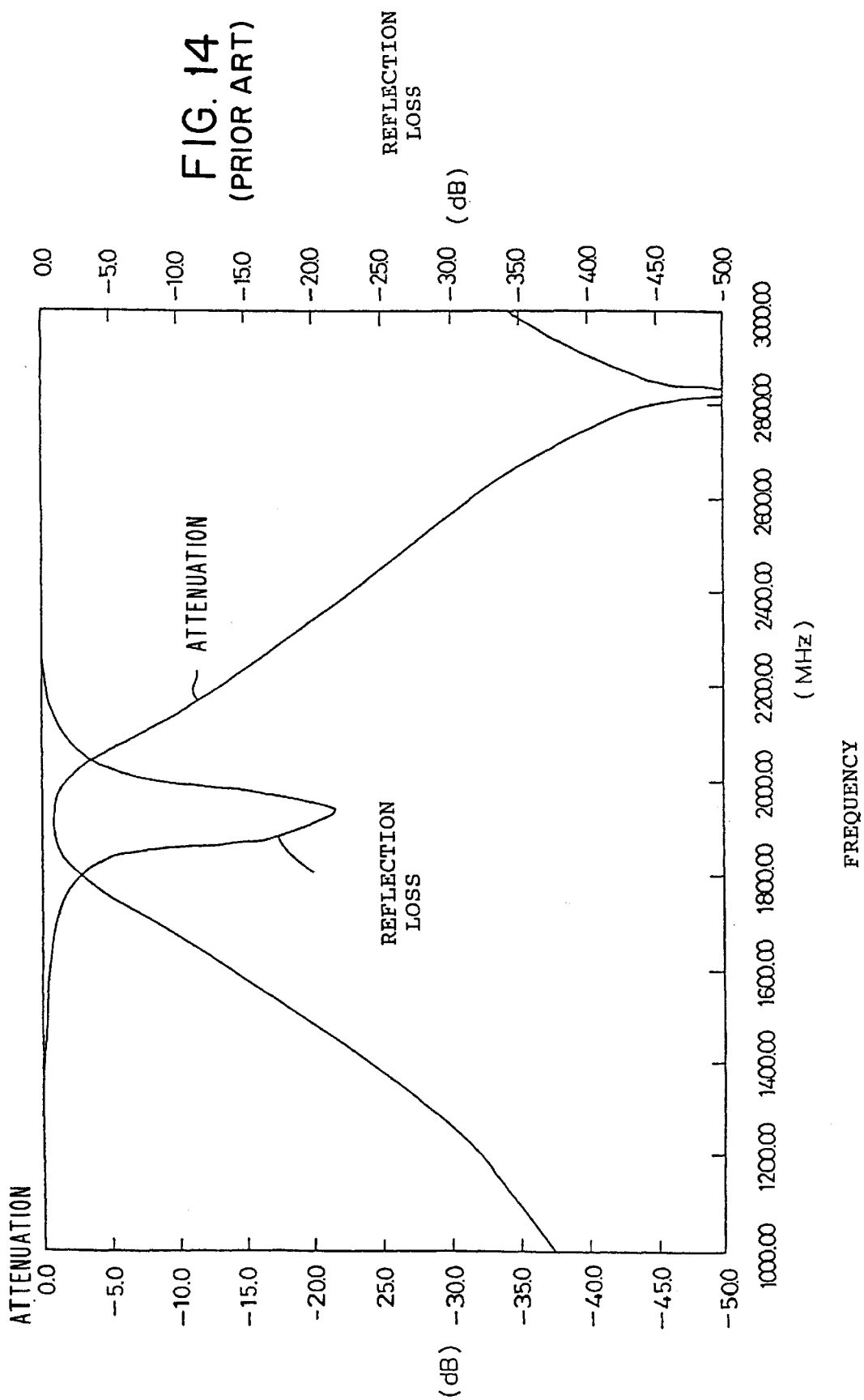
FIG. 14 is a graph showing the frequency characteristics of a conventional chip type filter.
Figure 15:
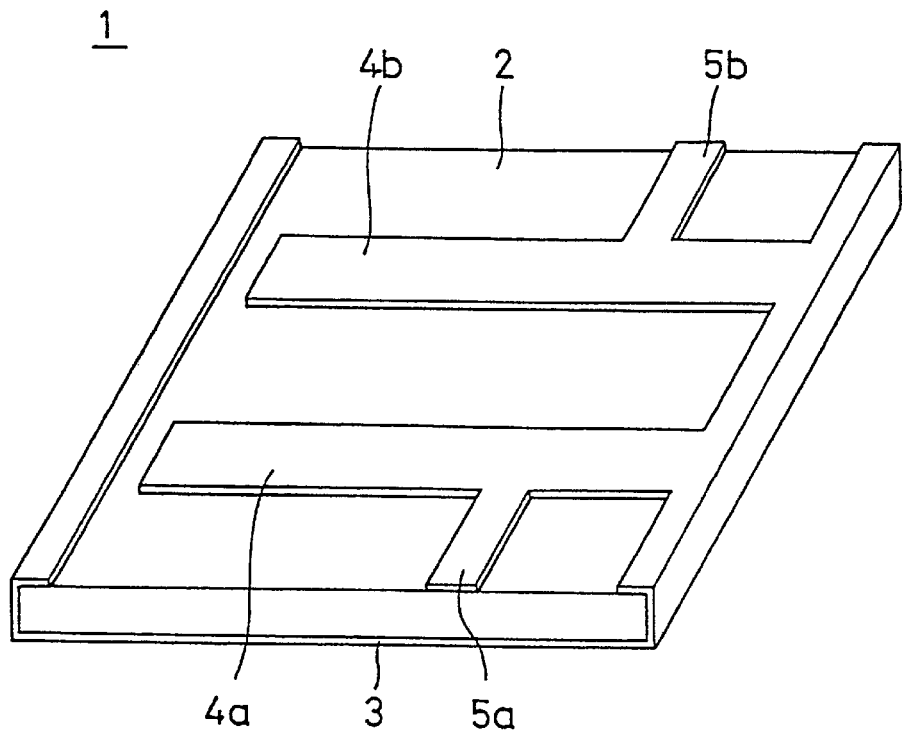
FIG. 15 is a perspective view showing an example of a conventional chip type filter.

In addition, an inductance may be formed at the input/output electrodes 24 and 28 as shown in FIG. 12. The formation of the inductance results in the formation of attenuation poles on both sides of the pass band. The formation of the attenuation poles makes it possible to obtain a chip type filter having high Q. The characteristics of this chip type filter 10 are shown in FIG. 13 and the following Table 3. Further, the characteristics of a conventional chip type filter are shown in FIG. 14 and Table 3. As apparent from those characteristic diagrams and Table 3, in this chip type filter 10, the insertion loss can be reduced by about 0.3 dB and the attenuation can be improved by about 10–25 dB without increasing the size of the filter. The inductance may be formed on either of the input/output electrodes 24 and 28.

TABLE 3

|  | Central Frequency (GHz) | −3 dB Bandwidth (MHz) | Insertion Loss (dB) |
| --- | --- | --- | --- |
| Prior Art | 1.910 | 275.0 | 1.30 |
| Embodiment | 1.885 | 260.0 | 1.00 |

As described above, this chip type filter 10 can be provided as a chip type filter having high Q and high attenuation. It is also possible to provide a chip type filter which is subjected to less insertion loss and in which input/output impedance can be matched. Further, a chip type filter having such advantages can be provided in a small size. In an embodiment of the invention, a chip type filter of 3.2 mm×1.6 mm can be provided. The reduction in the size of a chip type filter makes it possible to increase the number of chip type filters that can be obtained from a master substrate, thereby reducing the manufacturing cost.

The spiral-shaped pattern electrodes 20 and 22 can be formed using a thin film process. In this case, the use of a substrate having a high dielectric constant will make it possible to achieve higher accuracy with a significantly small size. Although a thin film tends to include more resistive components which lead to relatively large loss, a chip type filter having a performance higher than that of other types of chip type filters can be obtained as a result of reduction in resistive components achieved by the shorter resonator and the improvements in coupling, impedance matching, and Q provided according to the present invention.

While specific illustrated embodiments have been shown and described, it will be appreciated by those skilled in the art that various modifications, changes and additions may be made to the invention without departing from the spirit and scope thereof as set forth in the following claims.

What is claimed is:

1. A filter comprising:
   a dielectric substrate having first and second planar surfaces;
   a ground electrode formed on the first planar surface of the dielectric substrate;
   first and second planar pattern electrodes each having a spiral shape, wherein said planar pattern electrodes are both formed on the second planar surface of the dielectric substrate such that the planar pattern electrodes are disposed opposite to the ground electrode and separated by the thickness of the dielectric substrate;
   a common external ground electrode;
   said first and second planar pattern electrodes each include:
   an input/output electrode;
   an outer spiral portion;
   an end portion which is connected to said common external ground electrode;
   wherein the outer spiral portion of said first pattern electrode is disposed adjacent to the outer spiral portion of said second pattern electrode, such that a coupling provided using said dielectric substrate is established between said outer spiral portions of said first and second pattern electrodes;
   wherein the end portion of said first pattern electrode is disposed adjacent to the end portion of said second pattern electrode, such that a coupling provided using said dielectric substrate is established between said end portions of said first and second electrodes.

2. The filter of claim 1, wherein the coupling between said adjacent outer spiral portions is primarily capacitive coupling.

3. The filter of claim 1, wherein the coupling between said adjacent end portions is primarily inductive coupling.

4. The filter of claim 1, wherein said input/output electrode of said first pattern electrode is led out to a different edge of said second planar surface than the input/output electrode of said second pattern electrode.

5. The filter of claim 1, wherein said end portion of said first pattern electrode is joined to said end portion of said second -pattern electrode on said second planar surface.

6. The filter of claim 1, wherein said end portion of said first pattern electrode is entirely separated from said end portion of said second pattern electrode on said second planar surface.

7. The filter of claim 1, wherein both said first and second pattern electrodes include a curved portion in the form of an arc located between said end portion and said input/output electrode.

8. The filter of claim 7, wherein the curved portion has an inner radius R1 and an outer radius R2, such thar R2/R1=2/1 or greater.

9. The filter of claim 1, wherein said outer spiral portions of said first and second pattern electrodes are configured such that the strength of coupling is increased at selected locations along the lengths of said first and second outer spiral portions.

10. The filter of claim 9, wherein said outer spiral portions of said first and second pattern electrodes each include protruding portions, wherein the protruding portions of said first pattern electrode are directly adjacent to the protruding portions of said second pattern electrode, and wherein said increased coupling is established at said adjacent protruding portions.

* * * * *